United States Patent
Su et al.

(10) Patent No.: US 10,998,475 B2
(45) Date of Patent: May 4, 2021

(54) MICRO SEMICONDUCTOR CHIP, MICRO SEMICONDUCTOR STRUCTURE, AND DISPLAY DEVICE

(71) Applicant: PlayNitride Display Co., Ltd., Miaoli County (TW)

(72) Inventors: Yi-Min Su, Miaoli County (TW); Chih-Ling Wu, Miaoli County (TW); Gwo-Jiun Sheu, Miaoli County (TW); Sheng-Chieh Liang, Miaoli County (TW); Tzu-Yang Lin, Miaoli County (TW)

(73) Assignee: PLAYNITRIDE DISPLAY CO., LTD., Miaoli County (TW)

(*) Notice: Subject to any disclaimer, the term of this patent is extended or adjusted under 35 U.S.C. 154(b) by 0 days.

(21) Appl. No.: 16/691,138

(22) Filed: Nov. 21, 2019

(65) Prior Publication Data
US 2021/0083156 A1   Mar. 18, 2021

(30) Foreign Application Priority Data
Sep. 16, 2019 (TW) .................. 108133178

(51) Int. Cl.
*H01L 33/58* (2010.01)
*F21V 8/00* (2006.01)

(52) U.S. Cl.
CPC ............ *H01L 33/58* (2013.01); *G02B 6/0073* (2013.01)

(58) Field of Classification Search
CPC .............................. H01L 33/58; G02B 6/0073
USPC .............................................. 257/79
See application file for complete search history.

(56) References Cited

U.S. PATENT DOCUMENTS
10,193,034 B2 * 1/2019 Sperl ................ H01L 33/507

FOREIGN PATENT DOCUMENTS
| CN | 109935575 A | 6/2019 |
| CN | 110010745 A | 7/2019 |
| TW | 200926452 A | 6/2009 |
| WO | WO 2018/139687 A1 | 8/2018 |

OTHER PUBLICATIONS

Chinese Office Action and Search Report dated May 26, 2020 for Application No. 201910870131.8.
Taiwanese Office Action and Search Report dated May 11, 2020 for Application No. 108133178.

* cited by examiner

*Primary Examiner* — Tu-Tu V Ho
(74) *Attorney, Agent, or Firm* — Birch, Stewart, Kolasch & Birch, LLP (57) ABSTRACT

A micro semiconductor chip, a micro semiconductor structure, and a display device are provided. The micro semiconductor chip includes an epitaxial layer, a first electrode, a second electrode and a side light guide element. The epitaxial layer has a top surface, a bottom surface and a side surface. The first electrode and the second electrode are disposed on the bottom surface of the epitaxial layer. The side light guide element disposed on the side surface has a connecting portion and an extending portion. The connecting portion is in contact with a part of the extending portion, and the extending portion extends away from the side surface of the epitaxial layer. The extending portion has a top surface and a bottom surface, wherein a plane containing the top surface of the epitaxial layer forms an acute angle $\theta 1$ with a plane containing the top surface of the extending portion.

16 Claims, 11 Drawing Sheets

MICRO SEMICONDUCTOR CHIP, MICRO SEMICONDUCTOR STRUCTURE, AND DISPLAY DEVICE

CROSS REFERENCE TO RELATED APPLICATIONS

This Application claims priority of Taiwan Patent Application No. 108133178, filed on Sep. 16, 2019, the entirety of which is incorporated by reference herein.

BACKGROUND

Field of the Disclosure

The present disclosure relates to a micro semiconductor chip, a micro semiconductor structure, and display device employing the same.

Description of the Related Art

With the advancements being made in the field of optoelectronics technology, the size of optoelectronic components has gradually evolved toward miniaturization. In recent years, due to breakthroughs in the size of light-emitting diodes (LEDs), micro light-emitting diode (micro LED) displays, in which arrays of light-emitting diodes are arranged in an array, have increasingly interested people in the field. A micro LED display is an active micro semiconductor device display, and it is more energy-efficient than organic light-emitting diode (OLED) displays. Furthermore, a micro LED display has better contrast performance than an OLED display, and it is visible in sunlight.

The performance of the micro light emitting diode display depends on the light extraction efficiency of the micro light emitting diode chip used in the micro light emitting diode display. Therefore, a novel micro light emitting diode chip with improved light extraction efficiency is desired.

BRIEF SUMMARY

According to embodiments of the disclosure, the disclosure provides a micro semiconductor chip, a micro semiconductor structure and a display device thereof. The micro semiconductor chip includes an epitaxial layer, a first electrode, a second electrode, and a side light guide element. The epitaxial layer has a top surface, a bottom surface, and a side surface, wherein the top surface is opposite to the bottom surface, and the side surface connects the top surface to the bottom surface. The first electrode and the second electrode are disposed on the bottom surface of the epitaxial layer. The side light guide element is disposed on the side surface of the epitaxial layer, wherein, the side light guide element includes a connecting portion and an extending portion, wherein the connecting portion is in contact with a part of the extending portion, and the extending portion extends away from the side surface of the epitaxial layer. The extending portion has a top surface and a bottom surface, and a plane containing the top surface of the epitaxial layer forms an acute angle $\theta 1$ with a plane containing the top surface of the extending portion.

According to embodiments of the disclosure, the side light guide element may consist of a thermal reflowable material, wherein the refractive index of the side light guide element is greater than 1, and the refractive index of the side light guide element is less than or equal to the refractive index of the epitaxial layer.

According to embodiments of the disclosure, the plane containing the top surface of the epitaxial layer is parallel to a plane containing the bottom surface of the extending portion.

According to embodiments of the disclosure, a plane containing the bottom surface of the extending portion forms an acute angle $\theta 2$ with the plane containing the top surface of the extending portion, and acute angle $\theta 1$ is not equal to acute angle $\theta 2$.

According to embodiments of the disclosure, the ratio (L1/L) of the maximum height L1 of the side light guide element in the light extraction direction to the maximum height L of the epitaxial layer in the light extraction direction is between 0.1 and 0.8.

According to embodiments of the disclosure, the ratio (L3/L2) of the maximum height L3 of the connecting portion of the side light guide element in the light extraction direction to the maximum height L2 of the extending portion of the side light guide element in the light extraction direction is between 0.1 and 0.5.

According to embodiments of the disclosure, the micro semiconductor chip further includes an insulating layer disposed on the side surface of the epitaxial layer, wherein the side light guide element is in contact with the insulating layer disposed on the side surface of the epitaxial layer.

According to embodiments of the disclosure, the connecting portion is in direct contact with the insulating layer. The interface between the connecting portion and the insulating layer has an area S2, and the orthogonal projection of the side light guide element onto the insulating layer has an area of S1. In particular, S2/S1 is between 0.1 and 0.8.

According to embodiments of the disclosure, the interface between the connecting portion and the extending portion is perpendicular to top surface of the epitaxial layer. The orthogonal projection of the interface onto the plane containing the top surface of the epitaxial layer is a line segment, and wherein the line segment overlaps a part of the edge of the orthogonal projection of the insulating layer onto the plane containing the top surface of the epitaxial layer.

According to embodiments of the disclosure, in a cross-section, a part of the extending portion of the side light guide element is separated from the insulating layer by a space.

According to embodiments of the disclosure, in a cross-section, the ratio (W2/W1) of the maximum horizontal width W2 of the connecting portion to the maximum horizontal width W1 of the extending portion is between 0.01 and 0.5. The aforementioned cross-section is parallel to the light extraction direction, and the aforementioned cross-section is perpendicular to the interface between the connecting portion and the extending portion.

According to embodiments of the disclosure, the ratio (D1/L) of the minimum distance D1 between the extending portion of the side light guide element and the top surface of the epitaxial layer in the light extraction direction to the maximum height L of the epitaxial layer in the light extraction direction is between 0.01 and 0.5.

According to embodiments of the disclosure, the micro semiconductor chip further includes a top light guide element disposed on the top surface of the epitaxial layer.

According to embodiments of the disclosure, the top light guide element has a curved surface on the light extraction direction side.

According to embodiments of the disclosure, the disclosure also provides a micro semiconductor structure. The micro semiconductor structure includes a substrate; at least one of the aforementioned micro semiconductor chips disposed on the substrate; and at least one supporting element.

One end of the supporting element is disposed on the top surface of the substrate, and the other end of the supporting element is connected to the side light guide element of the micro semiconductor chip.

According to embodiments of the disclosure, the disclosure also provides a display device (such as micro light emitting display device). The display device includes a display substrate; and at least one of the aforementioned micro semiconductor chips disposed on the display substrate.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION

The micro semiconductor chip, micro semiconductor structure and the display device of the disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that is in direct contact with the other layer, and they may also refer to a layer hat does not directly contact the other layer, there being one or more intermediate layers disposed between the layer and the other layer.

The drawings provided are only schematic diagrams and are non-limiting. In the drawings, the size, shape, or thickness of some of the elements may be exaggerated and not drawn to scale, for illustrative purposes. The dimensions and the relative dimensions do not correspond to actual location in the practice of the disclosure. The disclosure will be described with respect to particular embodiments and with reference to certain drawings, but the disclosure is not limited thereto.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The disclosure provides a micro semiconductor chip (such as micro light emitting diode), a micro semiconductor structure and a display device employing the same. By means of the specific side light guide element, the light, which is emitted by the micro semiconductor chip and emits into the side light guide element, can be focused at the light extraction direction. Therefore, the light extraction efficiency in the light extraction direction of the micro semiconductor chip can be improved. As a result, the performance of the display device (such as micro light emitting diode display device) employing the micro semiconductor chip can also be improved.

The micro semiconductor chip of the disclosure means a semiconductor chip which has a length, width and height within a range of 1 μm to 100 μm. According to embodiments of the disclosure, the micro semiconductor chip may have a maximum width of 20 μm, 10 μm, or 5 μm. In some embodiments, the micro semiconductor chip may have a maximum height of 10 μm or 5 μm. However, it should be understood that embodiments of the disclosure are not limited thereto, and aspects of certain embodiments may be applied to larger and perhaps smaller scales.

According to embodiments of the disclosure, the micro semiconductor chip of the disclosure can be a micro semiconductor chip employing a p-n diode, such as a micro semiconductor chip which can be controlled to perform predetermined opto-electronic functions. For example, the micro semiconductor chip can be a light-emitting diode chip, a laser diode chip, or a photodiode chip. In addition, compared with general LED technology, the dimension of the micro semiconductor chip is reduced from the millimeter level to the micron level, and therefore the micro semiconductor chip of the present disclosure is transferred and assembled to obtain a micro LED display. The resulted micro LED display can achieve high resolution and reduce the power consumption of display, and therefore, it has such advantages as being energy-saving, having a simple mechanism, being thin, and so on.

Figure 1:
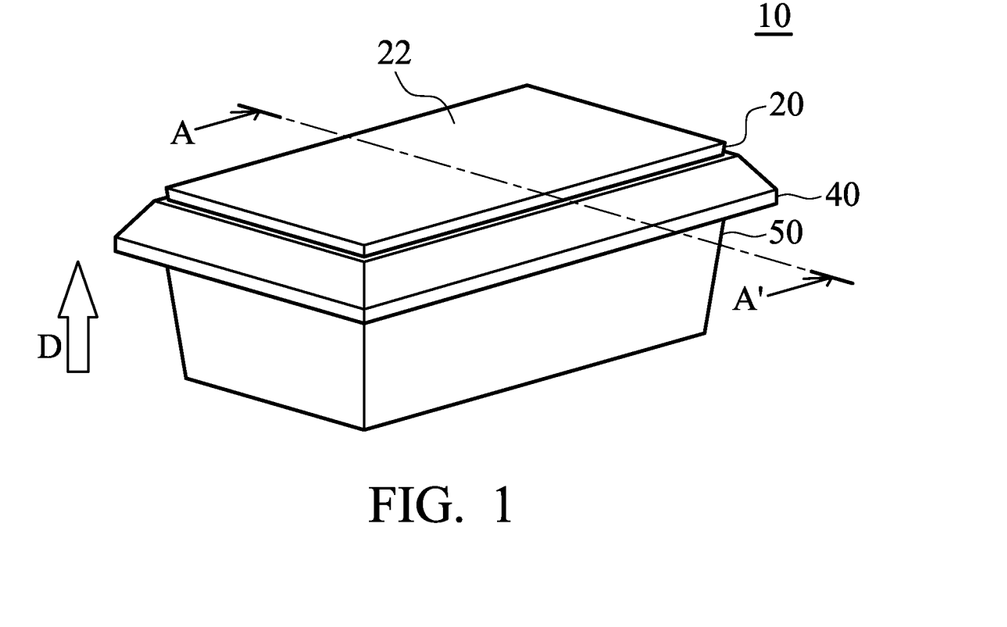
FIG. 1 is a schematic diagram of the micro semiconductor chip according to an embodiment of the disclosure.
Figure 2:
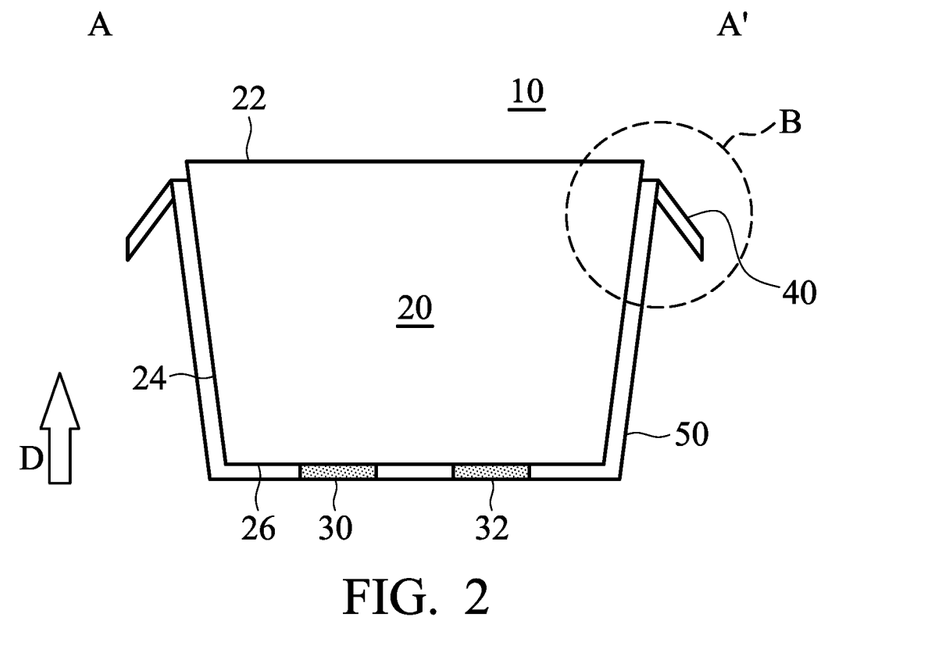
FIG. 2 is a cross-sectional diagram of the micro semiconductor chip taken along line A-A' of FIG. 1.

FIG. 1 is a schematic diagram of the micro semiconductor chip 10 according to an embodiment of the disclosure and FIG. 2 is a cross-sectional diagram of the micro semiconductor chip 10 taken along line A-A' of FIG. 1.

As shown in FIGS. 1 and 2, the micro semiconductor chip 10 of the disclosure can include an epitaxial layer 20, a first electrode 30, a second electrode 32, a side light guide element 40, and an insulating layer 50. The epitaxial layer 20 can have a top surface 22, a bottom surface 26, and a side surface 24. The top surface 22 of the epitaxial layer 20 is opposite to the bottom surface 26 of the epitaxial layer 20, and the side surface 24 of the epitaxial layer 20 connects the top surface 22 to the bottom surface 26. The first electrode 30 and the second electrode 32 are disposed on the bottom surface 26 of the epitaxial layer 20. Namely, according to embodiments of the disclosure, the micro semiconductor chip of the disclosure can be a horizontal structure or a flip-chip structure (i.e. the first electrode 30 and the second electrode 32 are disposed on the same side of the epitaxial layer 20 of the micro semiconductor chip 10).

According to other embodiments of the disclosure, the epitaxial layer 20 of the micro semiconductor chip 10 of the disclosure can have a tapered sidewall. Namely, a cross-section of the epitaxial layer 20 can be an inverted trapezoid (which has a greater top width and a smaller bottom width), as shown in FIG. 2. According to other embodiments of the disclosure, the structure and the type of the epitaxial layer 20 are not limited. For example, the cross-section of the epitaxial layer 20 of the disclosure can be an inverted trapezoid, a rectangle, a trapezoid, or another suitable shape.

According to embodiments of the disclosure, the epitaxial layer 20 can include a first semiconductor layer, a light emitting layer, and a second semiconductor layer. The first semiconductor layer and the second semiconductor layer have opposite electrical properties. According to embodiments of the disclosure, the first semiconductor layer can be n-type semiconductor layer and second semiconductor layer can be p-type semiconductor layer. According to embodiments of the disclosure, the first semiconductor layer can be p-type semiconductor layer and second semiconductor layer can be n-type semiconductor layer. The light emitting layer and the second semiconductor layer are disposed sequentially on the first semiconductor layer. Namely, the light emitting layer can be disposed between the first semiconductor layer and the second semiconductor layer.

According to embodiments of the disclosure, the first electrode 30 and the second electrode 32 have opposite electrical properties. Suitable materials of the first electrode 30 and the second electrode 32 can be magnesium, calcium, aluminum, silver, indium, gold, tungsten, nickel, platinum, copper, or an alloy thereof, or an oxide thereof or a combination thereof.

According to embodiments of the disclosure, the insulating layer 50 can be disposed on at least one part of the bottom surface 26 of the epitaxial layer 20. For example, the insulating layer 50 can be disposed between the first electrode 30 and the second electrode 32, in order to prevent the first electrode 30 and the second electrode 32 from contacting each other to cause short circuit. In addition, the insulating layer 50 can further extend to cover at least one part of the side surface 24 of the epitaxial layer 20, as shown in FIG. 2, in order to protect the epitaxial layer 20. According to embodiments of the disclosure, suitable materials of the insulating layer 50 can be an insulating material having a high transmittance (greater than or equal to 80%, such as 80%, 90% or 99%). Furthermore, the insulating layer 50 can include organic resin (such as benzocyclobutene, phenol formaldehyde resin, polysiloxane resin, epoxy resin, polyisoprene rubber, polyimide resin or a combination thereof), inorganic material (such as silicon oxide, silicon nitride, silicon oxynitride, or a combination thereof), or a combination thereof. According to embodiments of the disclosure, the material of the insulating layer 50 of the disclosure and the material of the side light guide element 40 can be the same, and the insulating layer 50 of the disclosure and the side light guide element 40 can be formed in the same process. Namely, the insulating layer 50 and the side light guide element 40 are integrated therewith. As a result, since the insulating layer 50 and the side light guide element 40 can be formed by the same process, the process for fabricating the micro semiconductor chip 10 can be simplified, thereby improving the process efficiency and yield.

As shown in FIG. 1, the micro semiconductor chip 10 has a light extraction direction D, wherein the light extraction direction D is essentially set from the bottom surface 26 of the epitaxial layer 20 to the top surface 22 of the epitaxial layer 20. Namely, the top surface 22 of the epitaxial layer 20 serves as the light extraction side of the micro semiconductor chip 10. In general, the light extraction from the top surface of the micro semiconductor chip is greater than or equal to about 80% in comparison with the whole light extraction from the micro semiconductor chip. The light extraction from the side surface of the micro semiconductor chip is less than or equal to about 20% in comparison with the whole light extraction from the micro semiconductor chip.

Although most of the light emitted by the micro semiconductor chip 10 is emitted from the light extraction side (i.e. the top surface 22 of the epitaxial layer 20), some of the light emitted by the micro semiconductor chip 10 is emitted from the side surface 24 of the epitaxial layer 20, resulting in the light extraction efficiency of the micro semiconductor chip 10 in the light extraction direction being 10% to 20% lower than the whole luminescent efficiency of the micro semiconductor chip 10. In order to increase the light extraction efficiency of the micro semiconductor chip 10 in the light extraction direction, the micro semiconductor chip 10 of the disclosure includes a side light guide element 40, which can change the emission direction of the light which is emitted from the side surface 24 of the epitaxial layer 20. Therefore, the changed emission direction forms an included angle with the light extraction direction D, wherein the included angle is less than or equal to 45 degrees. As a result, the light extraction efficiency of the micro semiconductor chip 10 of the disclosure in the light extraction direction is forced to more closely match the whole luminescent efficiency of the micro semiconductor chip 10.

According to embodiments of the disclosure, the side light guide element 40 can be disposed on the side surface 24 of the epitaxial layer 20. As shown in FIG. 1, the side light guide element 40 can be disposed on an insulating layer 50 which covers the side surface 22 of the epitaxial layer 20. Namely, the side light guide element 40 can be disposed on the side surface 24 of the epitaxial layer 20 via the insulating layer 50. According to embodiments of the disclosure, the side light guide element 40 can be also directly disposed on the side surface 24 of the epitaxial layer 20.

Figure 3:
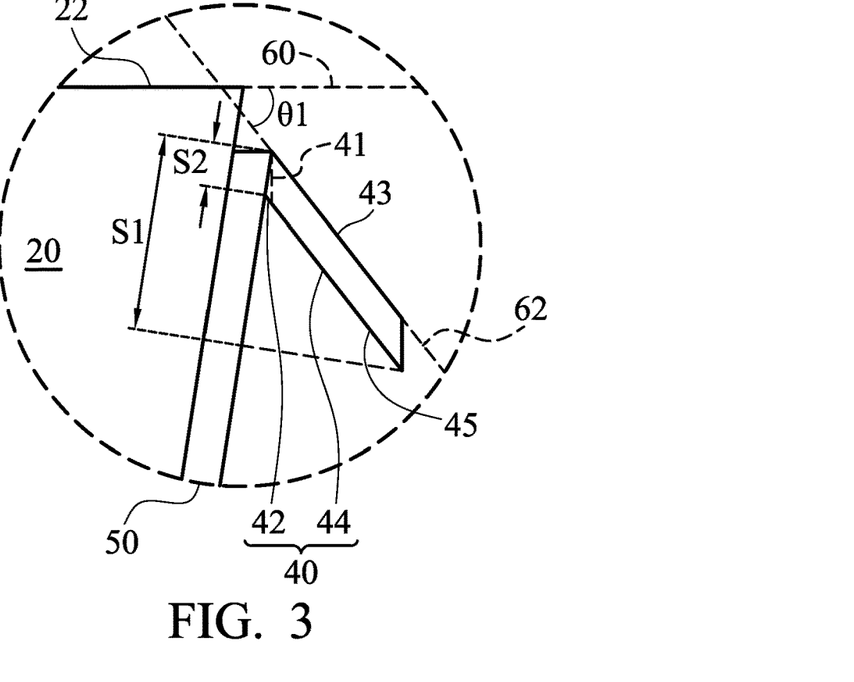
FIG. 3 presents a close-up view of the region B of the micro semiconductor chip shown in FIG. 1.

FIG. 3 presents a close-up view of the region B, which includes the side light guide element 40, of the micro semiconductor chip 10 as shown in FIG. 1. As shown in FIG. 3, the side light guide element 40 includes a connecting portion 42 and an extending portion 44, wherein the side light guide element 40 is connected to the insulating layer 50 of the epitaxial layer 20 via the connecting portion 42 (i.e. the connecting portion 42 of the side light guide element 40 is in direct contact with the insulating layer 50). The connecting portion 42 of the side light guide element 40 is in contact with a part of the extending portion 44. The extending portion 44 of the side light guide element 40 extends outward from the side surface 24 of the epitaxial layer 20, in order to maintain the distance from the side surface 24 of the epitaxial layer 20.

According to embodiments of the disclosure, the connecting portion 42 of the side light guide element 40 is in direct contact with the insulating layer 50. The interface between the connecting portion 42 and the insulating layer 50 has an area S2 (i.e. the contact area between the connecting portion 42 and the insulating layer 50). An orthogonal projection of the side light guide element 40 onto the insulating layer 50 has an area of S1. In particular, S2/S1 is between 0.1 and 0.8 (such as 0.1, 0.5 or 0.8). If S2/S1 is less than 0.1, the difficulty for fabricating the micro semiconductor chip 10 would be increased. Furthermore, if S2/S1 is greater than 0.8, the concentration of the light emitted by the micro semiconductor chip 10 will not be enhanced.

According to embodiments of the disclosure, as shown in FIG. 3, the extending portion 44 of the side light guide element 40 includes a top surface 43 and a bottom surface 45. The top surface 43 of the extending portion 44 of the side light guide element 40 and the top surface 22 of the epitaxial layer 20 essentially face in the light extraction direction D. The bottom surface 45 of the extending portion 44 of the side light guide element 40 and the bottom surface 26 of the epitaxial layer 20 essentially face in the opposite direction from the light extraction direction D. According to embodiments of the disclosure, a plane 60 containing the top surface 22 of the epitaxial layer 20 forms an acute angle $\theta 1$ with a plane 62 containing the top surface 43 of the extending portion 44 of the side light guide element 40. It should be noted that the acute angle $\theta 1$ is between 5 degrees and 85 degrees (such as from 10 degrees to 80 degrees, or from 20 degrees to 80 degrees). Therefore, the side light guide element 40 can change the emission direction of the light, which is emitted from the side surface 24 of the epitaxial layer 20, toward the light extraction direction D (i.e. the changed emission direction forms an included angle with the light extraction direction D, wherein the included angle is less than or equal to 45 degrees). The acute angle $\theta 1$ can be 10 degrees, 50 degrees or 80 degrees.

According to embodiments of the disclosure, the side light guide element 40 can be made of a material with high transmittance greater than or equal to 80% (such as 80%, 90% or 99%). The side light guide element 40 can be made of a material with a refractive index greater than 1 and less than (or equal to) the refractive index of the epitaxial layer 20. For example, the side light guide element 40 can have a refractive index from 1.05 to 2.5 (such as 1.05, 1.5, 2.0 or 2.5). Suitable materials of the side light guide element 40 can be organic resin (such as benzocyclobutene, phenol formaldehyde resin, polysiloxane resin, epoxy resin, polyisoprene rubber, polyimide resin or a combination thereof), inorganic material (such as silicon oxide, silicon nitride, silicon oxynitride, or a combination thereof), or a combination thereof.

According to embodiments of the disclosure, as shown in FIG. 3, the interface 41 between the connecting portion 42 of the side light guide element 40 and the extending portion 44 of the side light guide element 40 is perpendicular to the top surface 22 of the epitaxial layer 20. The orthogonal projection of the interface 41 onto the plane 60 including the top surface 22 of the epitaxial layer 20 is a line segment. According to embodiments of the disclosure, the line segment overlaps a part of the edge of the orthogonal projection of the insulating layer 50 onto the plane containing the top surface 22 of the epitaxial layer 20.

Figure 4:
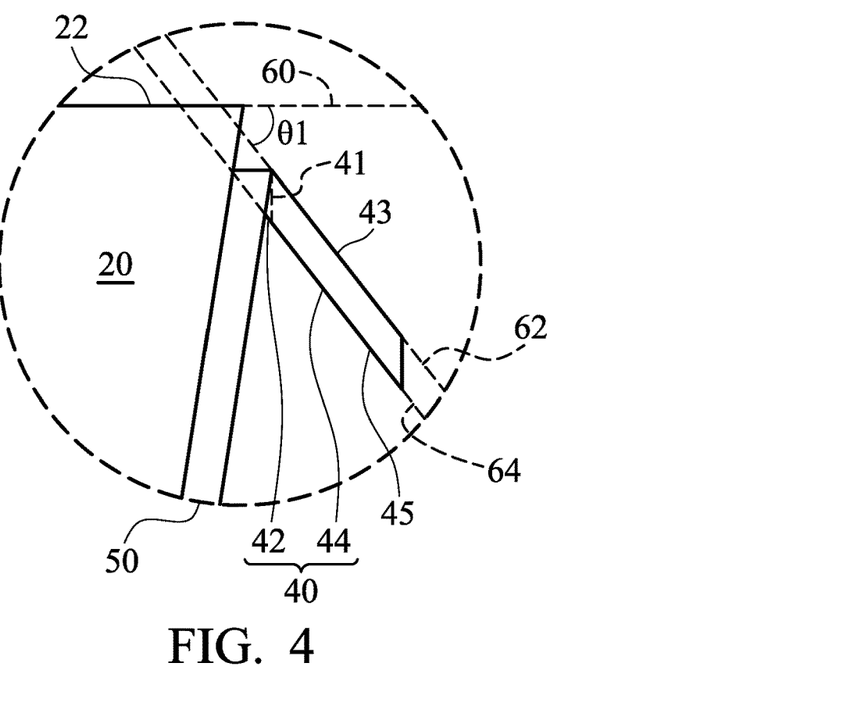
FIG. 4 presents a close-up view of the region including the side light guide element of the micro semiconductor chip according to embodiments of the disclosure.

According to embodiments of the disclosure, as shown in FIG. 4, the plane 62 containing the top surface 43 of the extending portion 44 of the side light guide element 40 is parallel to a plane 64 containing the bottom surface 45 of the extending portion 44 of the side light guide element 40. Furthermore, the thickness of the extending portion 44 of the side light guide element 40 is almost uniform, and the thickness difference between the thickest portion of the extending portion 44 and the thinnest portion of the extending portion 44 is not greater than 5%.

Figure 5:
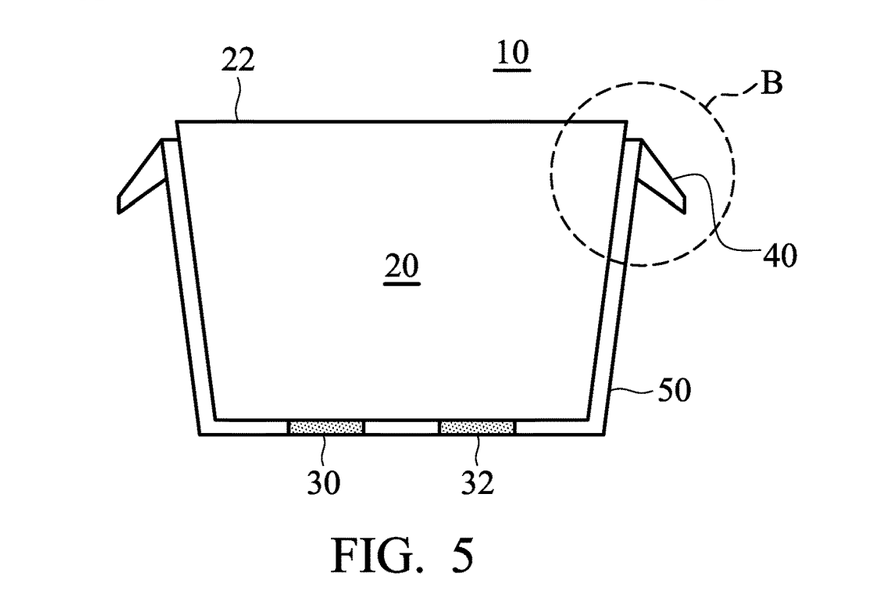
FIG. 5 is a cross-sectional diagram of the micro semiconductor chip according to some embodiments of the disclosure.
Figure 6:
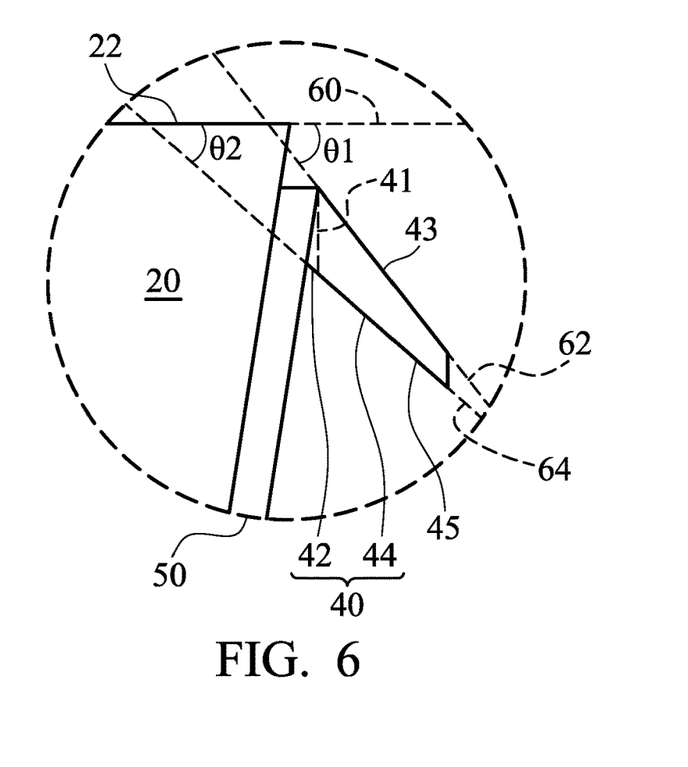
FIG. 6 presents a close-up view of the region B of the micro semiconductor chip shown in FIG. 5.

According to embodiments of the disclosure, as shown in FIGS. 5 and 6, the plane 60 containing the top surface 22 of the epitaxial layer 20 forms an acute angle $\theta 2$ with the plane 64 containing the bottom surface 45 of the extending portion 44 of the side light guide element 40. The degrees of the acute angle $\theta 1$ is greater than degrees of the acute angle $\theta 2$. For example, the degrees difference between the acute angle $\theta 1$ and the acute angle $\theta 2$ is between 1 degree and 60 degrees (such as 1 degree, 30 degrees or 60 degrees) in order to enhance the adhesion between the side light guide element 40 and the insulating layer 50, thereby improving the yield of subsequent process.

Figure 7:
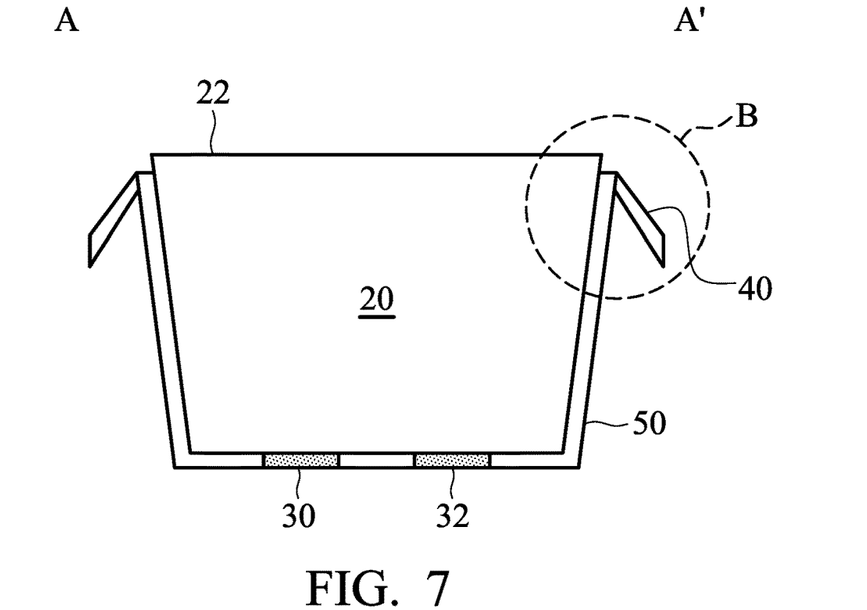
FIG. 7 is a cross-sectional diagram of the micro semiconductor chip according to some embodiments of the disclosure.
Figure 8:
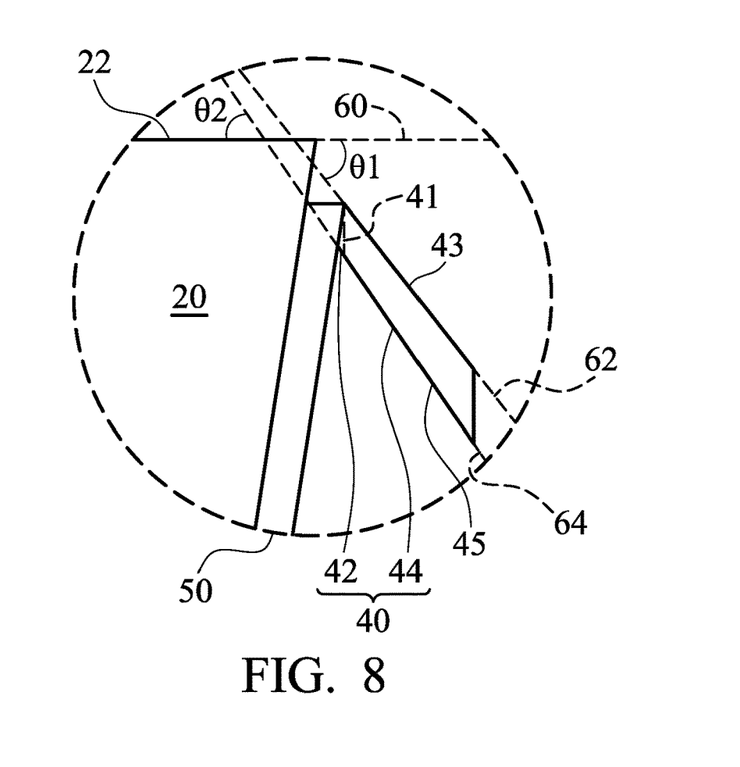
FIG. 8 presents a close-up view of the region B of the micro semiconductor chip shown in FIG. 7.

According to embodiments of the disclosure, as shown in FIGS. 7 and 8, the plane 60 containing the top surface 22 of the epitaxial layer 20 forms an acute angle $\theta 2$ with the plane 64 containing the bottom surface 45 of the extending portion 44 of the side light guide element 40. The degrees of the acute angle $\theta 1$ is less than the degrees of the acute angle $\theta 2$. For example, the degrees difference between the acute angle $\theta 1$ and the acute angle $\theta 2$ is between 1 degree and 60 degrees (such as 1 degree, 30 degrees or 60 degrees) in order to enhance the adhesion between the side light guide element 40 and the insulating layer 50, thereby increasing the process tolerance of the side light guide element 40.

Figure 9:
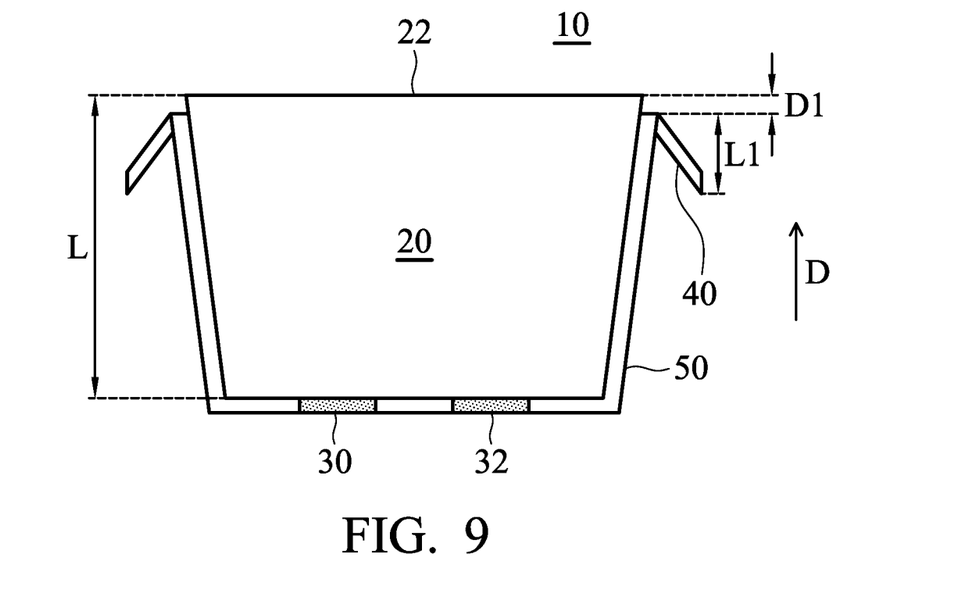
FIG. 9 is a cross-sectional diagram of the micro semiconductor chip according to some embodiments of the disclosure.

FIG. 9 presents a cross-sectional view of the micro semiconductor chip 10 according to the embodiment of the disclosure. As shown in FIG. 9 the side light guide element 40 has a maximum height L1 in the light extraction direction D and the epitaxial layer 20 has a maximum height L in the light extraction direction D. The ratio (L1/L) of L1 to L is between 0.1 and 0.8 (such as 0.1, 0.5 or 0.8). In addition, as shown in FIG. 9, the ratio (D1/L) of the minimum distance D1 between the side light guide element and the top surface 22 of the epitaxial layer 20 in the light extraction direction D to the maximum height L of the epitaxial layer 20 in the light extraction direction D is between 0.01 and 0.5 (such as 0.01, 0.1 or 0.5).

Figure 10:
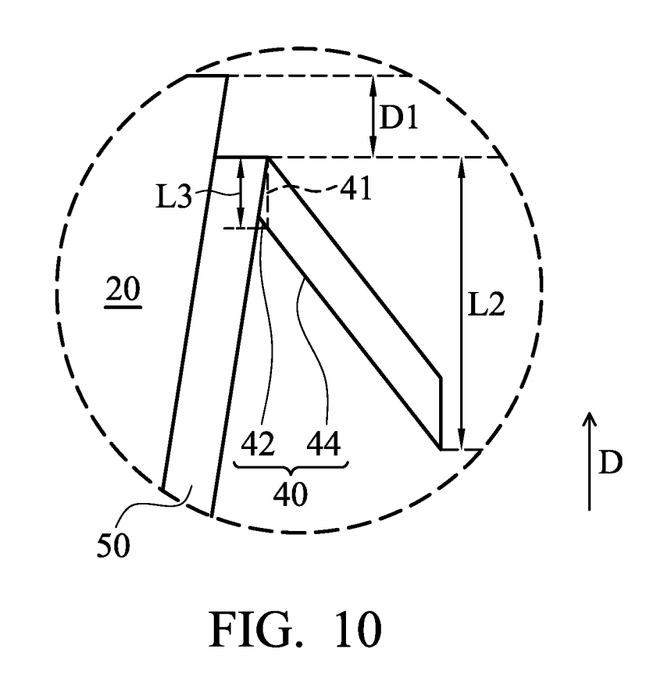
FIG. 10 presents a close-up view of the region including the side light guide element of the micro semiconductor chip according to embodiments of the disclosure.

FIG. 10 presents a close-up view of the region including the side light guide element 40 of the micro semiconductor chip 10 according to embodiments of the disclosure. As shown in FIG. 10, the ratio (L3/L2) of the maximum height L3 of the connecting portion 42 of the side light guide element 40 in the light extraction direction D to the maximum height L2 of the extending portion 44 of the side light guide element 40 in the light extraction direction D is not less than 0.1 and less than 1 (such as 0.1, 0.5 or 0.99).

Figure 11:
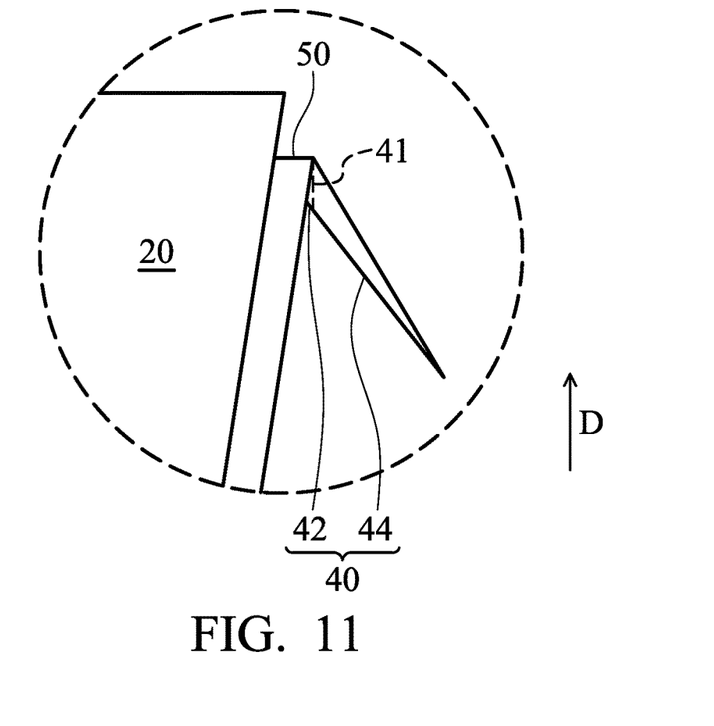
FIGS. 11-13 are close-up views of the region including the side light guide element of the micro semiconductor chip according to embodiments of the disclosure.
Figure 12:
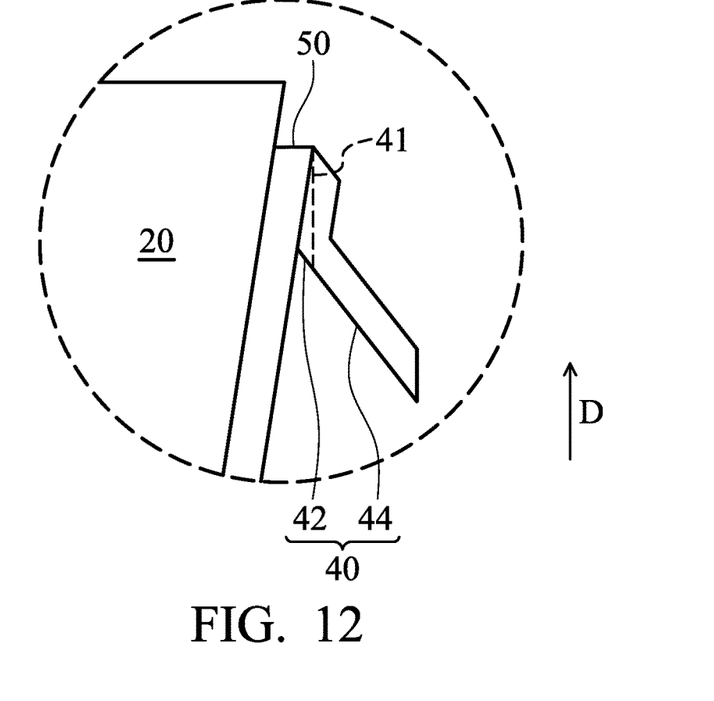

According to some embodiments of the disclosure, in a cross-section, the side light guide element 40 can be a polygonal, such as can be triangle (as shown in FIG. 11), tetragonal (as shown in FIGS. 4, 6 and 8), pentagonal, or L-shaped (as shown in FIG. 12), wherein the cross-section is parallel to the light extraction direction D and the cross-section is perpendicular to the interface 41 between the connecting portion 42 and the extending portion 44.

Figure 13:
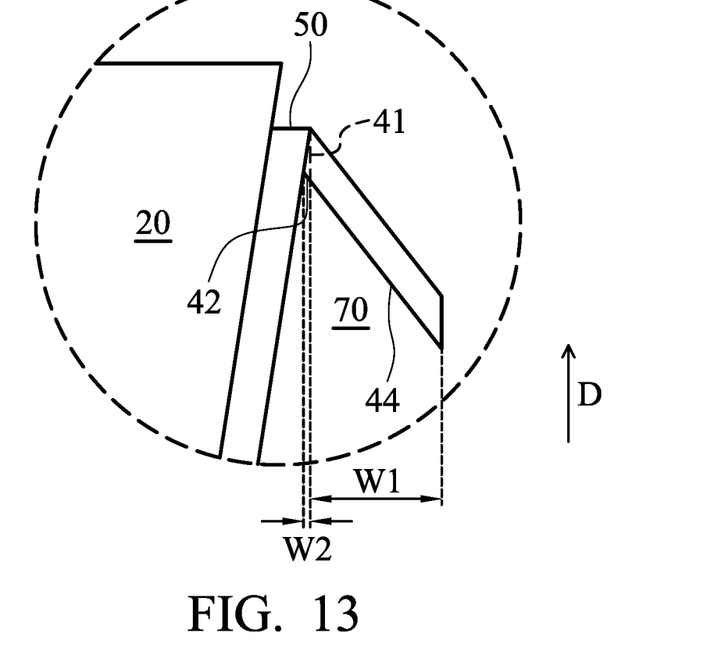

FIG. 13 presents a close-up view of the region including the side light guide element 40 of the micro semiconductor chip 10 according to embodiments of the disclosure. As shown in FIG. 13 in a cross-section, at least one part of the extending portion 44 of the side light guide element 40 is separated from the insulating layer 50 by a space 70, wherein the space 70 is an air space and the cross-section is parallel to the light extraction direction D and the cross-section is perpendicular to the interface 41 between the connecting portion 42 and the extending portion 44.

As shown in the cross-sectional diagram of FIG. 13, the ratio (W2/W1) of the maximum horizontal width W2 of the connecting portion 42 of the side light guide element 40 to the maximum horizontal width W1 of the extending portion 44 of the side light guide element 40 is between 0.01 and 0.5 (such as 0.01, 0.25 or 0.5).

Figure 14:
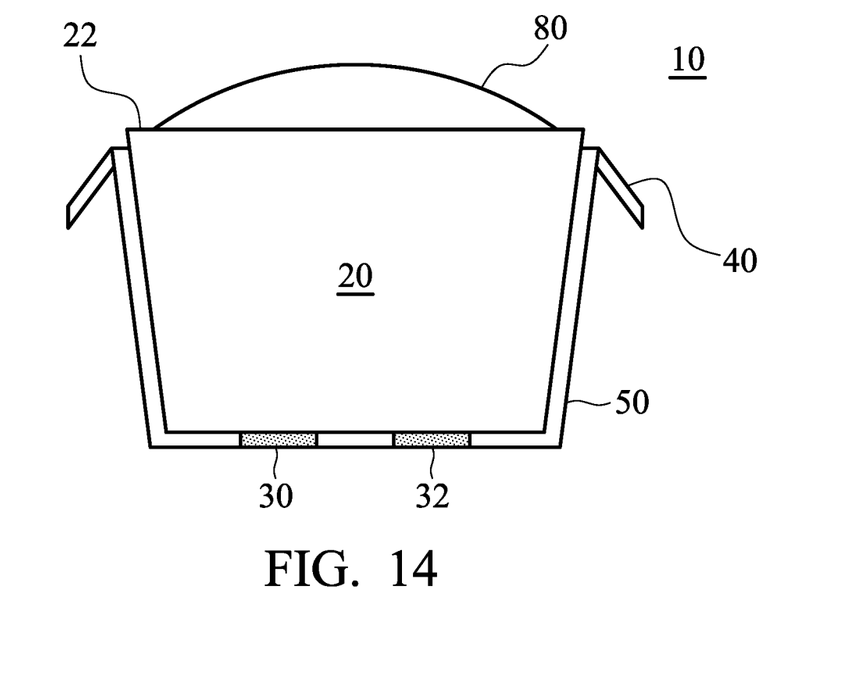
FIGS. 14 and 15 are cross-sectional diagrams of the micro semiconductor chips, which have the side light guide element and the top light guide element, according to some embodiments of the disclosure.

FIG. 14 is a cross-sectional diagram of the micro semiconductor chip 10 according to some embodiments of the disclosure. As shown in FIG. 14, the micro semiconductor chip 10 can further include a top light guide element 80 disposed on the top surface 22 of the epitaxial layer 20, wherein the top light guide element 80 faces the light extraction direction and can have a curved surface in order to improve the light extraction efficiency of the micro semiconductor chip 10. According to embodiments of the disclosure, the top light guide element 80 can be made of a material having a high transmittance (greater than or equal to 80%, such as 80%, 90% or 99%). The top light guide element 80 can have a refractive index greater than 1, and less than (or equal to) the refractive index of the epitaxial layer 20. For example, the top light guide element 80 can have a refractive index from 1.05 to 2.5 (such as 1.05, 1.5, 2.0 or 2.5). According to embodiments of the disclosure, suitable materials of the top light guide element 80 can be organic resin (such as benzocyclobutene, phenol formaldehyde resin, polysiloxane resin, epoxy resin, polyisoprene rubber, polyimide resin or a combination thereof), inorganic material (such as silicon oxide, silicon nitride, silicon oxynitride, or a combination thereof), or a combination thereof.

According to embodiments of the disclosure, the material of side light guide element 40 of the disclosure and the material of the top light guide element 80 can be the same. According to embodiments of the disclosure, the side light guide element 40 of the disclosure and the top light guide element 80 can be formed in the same process. As a result, the process for fabricating the micro semiconductor chip 10 can be simplified, thereby improving the process efficiency and yield.

Figure 15:
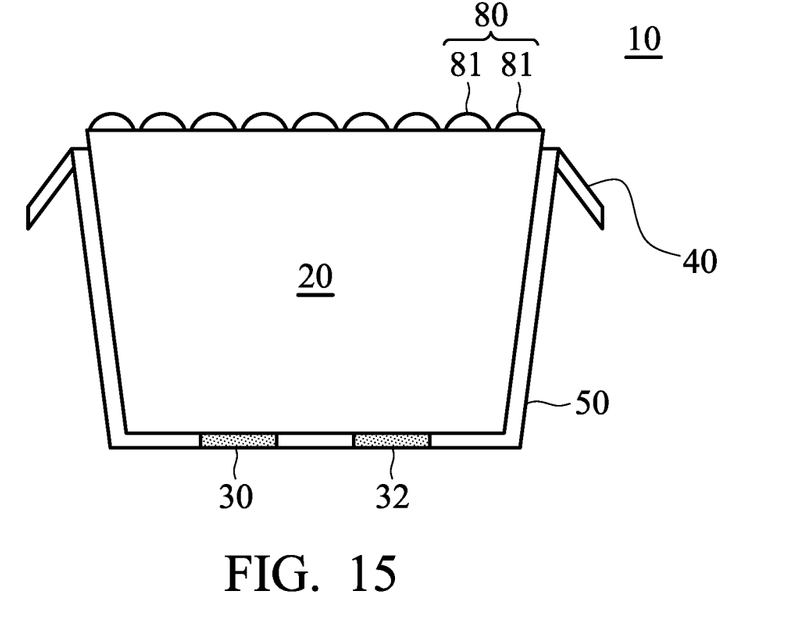

FIG. 15 is a cross-sectional diagram of the micro semiconductor chip 10 according to some embodiments of the disclosure. As shown in FIG. 15 the top light guide element 80 of the micro semiconductor chip 10 may consist of a plurality of micro-structures 81. The shape of the micro-structure 81 from a cross-section can be partially elliptical, partially elliptical circular, polygonal, or a combination thereof.

Figure 16:
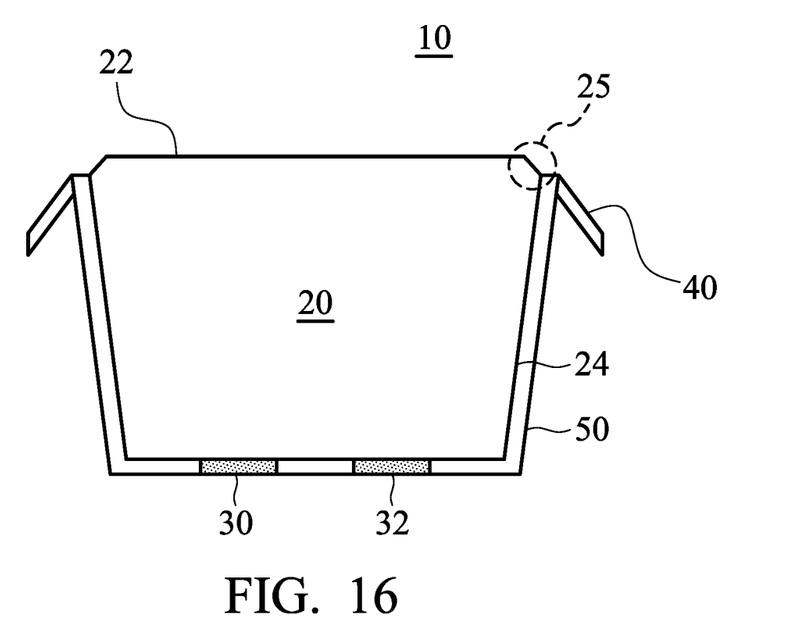
FIG. 16 is a cross-sectional diagram of the micro semiconductor chip according to some embodiments of the disclosure.

FIG. 16 is a cross-sectional diagram of the micro semiconductor chip 10 according to some embodiments of the disclosure. As shown in FIG. 16, a chamfer 25 can be formed at the connection of the top surface 22 of the epitaxial layer 20 and the side surface 24 of the epitaxial layer 20, thereby improving light extraction efficiency of the micro semiconductor chip 10.

Figure 17:
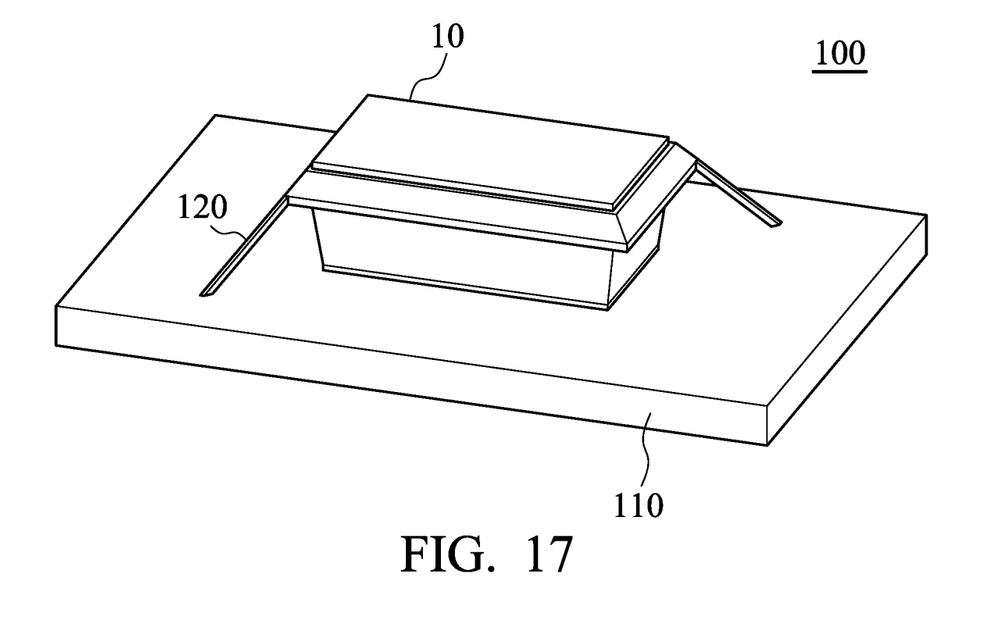
FIG. 17 is a cross-sectional diagram of the micro semiconductor structure according to some embodiments of the disclosure.
Figure 18:
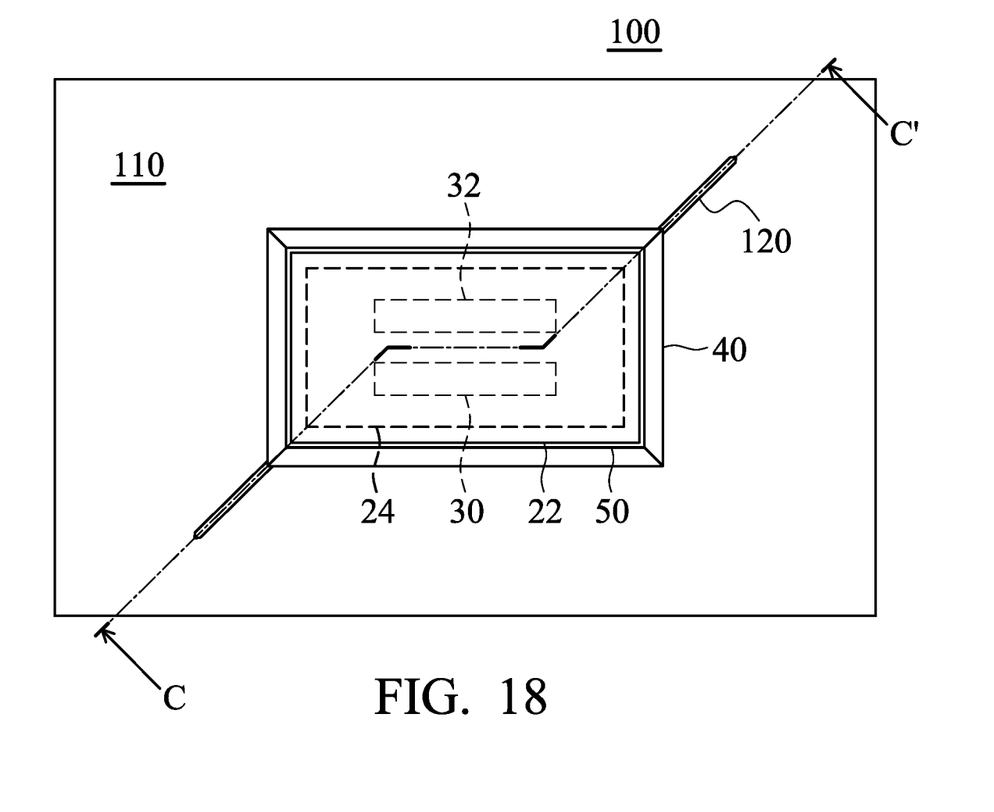
FIG. 18 is a schematic top-view diagram of the micro semiconductor structure as shown in FIG. 17.
Figure 19:
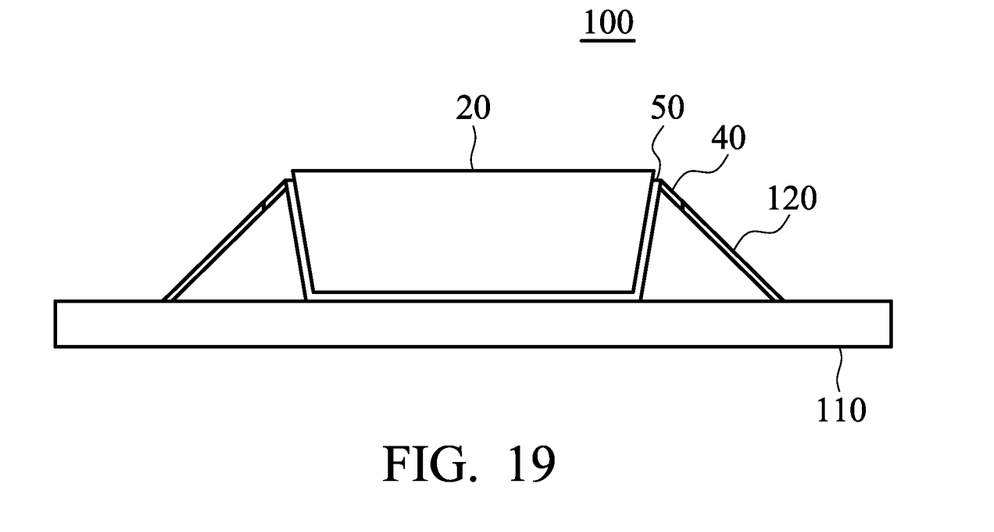
FIG. 19 is a cross-sectional diagram of the micro semiconductor structure taken along line C-C' of FIG. 18.

According to embodiments of the disclosure, the disclosure also provides a micro semiconductor structure. FIG. 17 presents a cross-sectional view of the micro semiconductor structure 100 according to some embodiments of the disclosure; FIG. 18 is a schematic top-view diagram of the micro semiconductor structure as shown in FIG. 17; and FIG. 19 is a cross-sectional diagram of the micro semiconductor structure 100 taken along line C-C' of FIG. 18.

As shown in FIG. 17, the micro semiconductor structure 100 includes a substrate 110, at least one of the aforementioned micro semiconductor chips 10 disposed on the substrate 110, and at least one supporting element, wherein one end of the supporting element 120 is disposed on the top surface 110 of the substrate, and the other end of the supporting element is connected to the side light guide element 40 of the micro semiconductor chip 10. As a result, the micro semiconductor chip 10 is fixed on the substrate 110 via the supporting element 120. According to embodiments of the disclosure, the side light guide element 40 is formed on the insulating layer 50. The side light guide element 40 is eaves-shaped and protrudes out of the insulating layer 50, as shown in FIG. 17.

According to embodiments of the disclosure, the substrate 110 can be a template for carrying the micro semiconductor chip 10 and the supporting element 120. The substrate 110 can be a plastic substrate, a ceramic substrate, a glass substrate, a sapphire substrate, or another rigid substrate.

According to embodiments of the disclosure, the supporting element 120 can affix the micro semiconductor chip 10 to the substrate 110 to maintain a specific distance between two adjacent micro semiconductor chips 10. As a result, the supporting element can prevent the micro semiconductor chips from being damaged during the subsequent transfer process, thereby increasing the yield of the subsequent transfer process.

Figure 20:
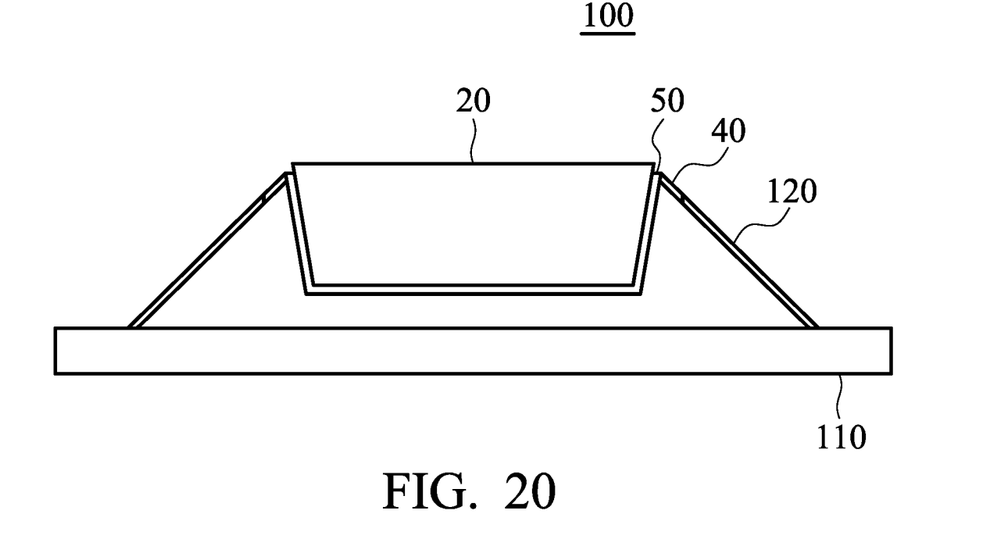
FIG. 20 is a cross-sectional diagram of the micro semiconductor structure according to some embodiments of the disclosure.

According to embodiments of the disclosure, as shown in FIG. 20, the supporting element 120 can support the micro semiconductor chip 10 to keep the micro semiconductor chip 10 away from the substrate 110, thereby reducing the difficulty of the subsequent transfer process.

As shown in FIG. 18, the side light guide element 40 can be formed on the insulating layer 50, which is disposed on the all side surfaces 24 of the epitaxial layer 20. Namely, the side light guide element 40 can be disposed on the side surface 24 of the epitaxial layer 20 and surround the epitaxial layer 20.

Figure 21:
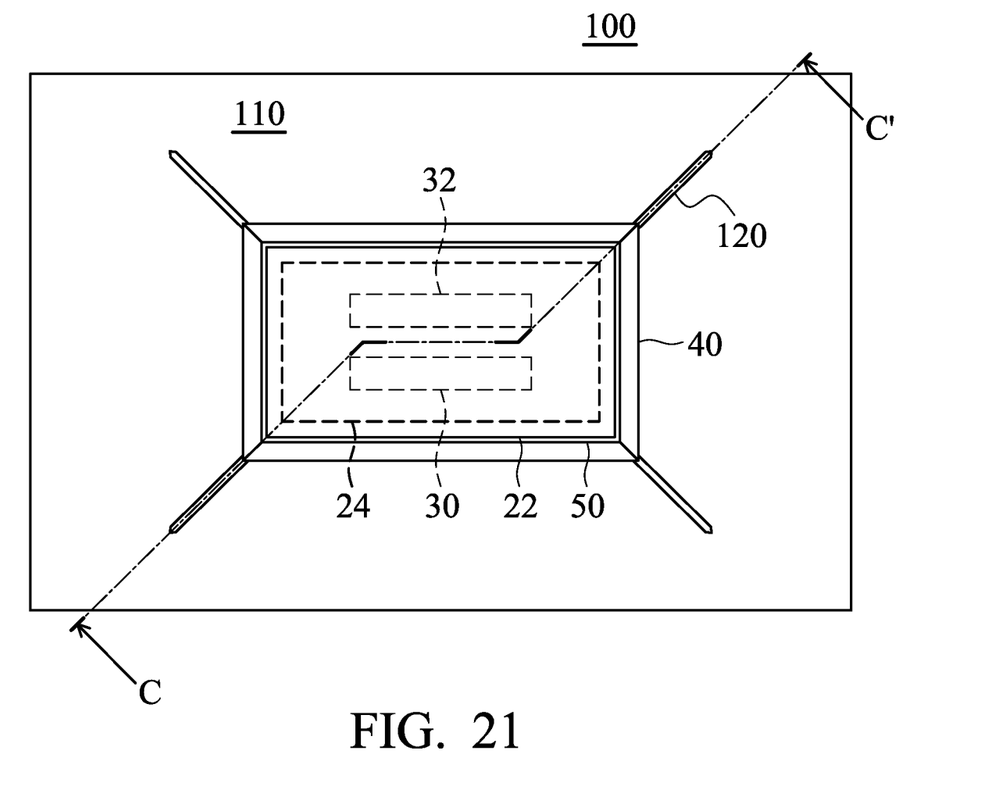
FIG. 21 is a schematic top-view diagram of the micro semiconductor structure according to some embodiments of the disclosure.

As shown in FIG. 18, the supporting element 120 can be disposed on the micro semiconductor chip 10 and contact the side light guide element 40. According to embodiments of the disclosure, the supporting element 120 disposed on the side light guide element 40 extends outward from the interface of two adjacent side surfaces 24 of the epitaxial layer 20. According to embodiments of the disclosure, the supporting element 120 can disposed on two vertices (which a straight line connecting the two vertices overlaps a diagonal of the micro semiconductor chip 10) of the micro semiconductor chip 10, as shown in FIG. 18. According to embodiments of the disclosure, the supporting element 120 can be disposed on the four vertices of the micro semiconductor chip 10, as shown in FIG. 21.

According to embodiments of the disclosure, suitable materials of the supporting element 120 can be inorganic material or organic resin in order to stably fix the micro semiconductor chip 10 on the substrate 110.

According to embodiments of the disclosure, the material of the supporting element 120 and the material of the side light guide element 40 can be the same. According to embodiments of the disclosure, the supporting element 120 can be made of a material having a high transmittance (greater than or equal to 80%, such as 80%, 90% or 99%). According to embodiments of the disclosure, suitable materials of the supporting element 120 can be organic resin (such as benzocyclobutene, phenol formaldehyde resin, polysiloxane resin, epoxy resin, polyisoprene rubber, polyimide resin or a combination thereof), inorganic material (such as silicon oxide, silicon nitride, silicon oxynitride, or a combination thereof), or a combination thereof. According to embodiments of the disclosure, the material of the supporting element 120 and the material of the side light guide element 40 can be the same. Furthermore, the supporting element 120 and the side light guide element can be formed in the same process. Namely, the supporting element 120 and the side light guide element 40 are integrated therewith. According to embodiments of the disclosure, since the supporting element 120 and the side light guide element are made of the same material, the supporting element 120 and the side light guide element 40 can be formed simultaneously. As a result, since the supporting element 120 and the side light guide element 40 can be formed by the same process, the process for fabricating the micro semiconductor structure 100 can be simplified, thereby improving the process efficiency and yield.

According to embodiments of the disclosure, the supporting element 120, the side light guide element 40 and the top light guide element 80 can be made of the same material. According to embodiments of the disclosure, the supporting element 120 of the disclosure, the side light guide element 40 and the top light guide element 80 can be made of the same material and formed in the same process (i.e. the supporting element 120, the side light guide element 40 and the top light guide element 80 can be integrated therewith). Since the supporting element 120, the side light guide element 40, and the top light guide element 80 are made of the same material, the side light guide element 40 and the top light guide element 80 can be formed simultaneously in the process for forming the supporting element 120. As a result, since the supporting element 120, the side light guide element 40 and the top light guide element 80 can be formed by the same process, the process for fabricating the micro semiconductor structure 100 can be simplified, thereby improving the process efficiency and yield. According to embodiments of the disclosure, the micro semiconductor chip can be subsequently transferred and assembled into a variety of illumination or display applications, such as a display device. The display device can include other components depending on its application. These other components include (but are not limited to) memory, touch panel controllers, and batteries. In other embodiments, the micro LED display can be a television, tablet computer, cell phone, laptop computer, computer monitor, stand-alone terminal server, digital camera, handheld game console, media display, electronics book display, car display or large area electronic board display.

Figure 22:
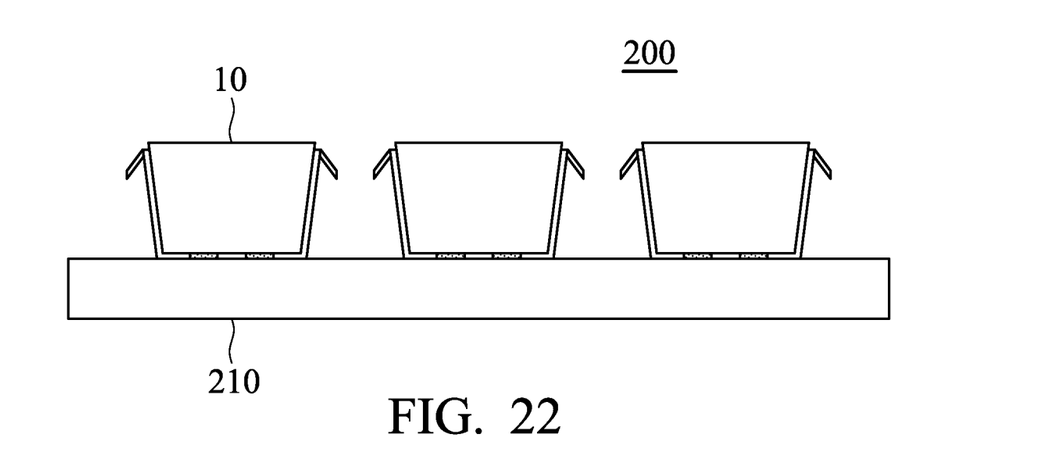
FIG. 22 is a cross-sectional diagram of the display device according to some embodiments of the disclosure.

According to embodiments of the disclosure, the disclosure also provides a display device. FIG. 22 is a cross-sectional diagram of the display device 200 according to some embodiments of the disclosure. According to embodiments of the disclosure, by means of a transfer process, the micro semiconductor chip 10 can be transferred to a display substrate 210, obtaining the display device 200 (such as micro light emitting diode display device). During the transfer process, the supporting element 120 can be removed from the micro semiconductor chip 10. Namely, the side light guide element 40 of the micro semiconductor chip 10 does not connect the supporting element 120 after the transfer process.

According to embodiments of the disclosure, the transfer process can be a mass transfer process. The mass transfer process can be performed to transfer the micro semiconductor chips 10 from the substrate 110 to the display substrate 210 one at a time or in a batch, obtaining the display device 200.

According to embodiments of the disclosure, the transfer process can include a pickup step and a place step. In the pickup step, the micro semiconductor chip 10 on the substrate 110 can be picked up by a transfer device. For example, methods of mechanical electrostatic attraction, vacuum drawing or adhesion by adhesive tape are used to perform the transfer process. In the pickup step, the supporting element 120 is separated from the side light guide element 40 of the micro semiconductor chip 10 so that the micro semiconductor chip 10 is separated from the substrate 110. In the place step, the micro semiconductor chip 10 is disposed on the display substrate 210 via the transfer device. According to embodiments of the disclosure, a plurality of control circuits (not shown) can be formed on the display substrate 210 in advance. After disposing each micro semiconductor chip 10 to a predetermined location, the micro semiconductor chip 10 can contact the contact pad of the corresponding control circuit, and the micro semiconductor chip 10 is fixed on the display substrate.

Accordingly, the micro semiconductor chip having the side light guide element of the disclosure can enhance the light extraction efficiency of the micro semiconductor chip and improve the performance of the display device employing the micro semiconductor chip.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A micro semiconductor chip, comprising:
   an epitaxial layer having a top surface, a bottom surface, and a side surface, wherein the top surface is opposite to the bottom surface, and the side surface connects the top surface to the bottom surface; and
   a side light guide element disposed on the side surface of the epitaxial layer, wherein the side light guide element comprises a connecting portion and an extending portion, wherein the connecting portion is in contact with a part of the extending portion, and the extending portion extends away from the side surface of the epitaxial layer, wherein the extending portion has a top surface and a bottom surface, wherein a plane containing the top surface of the epitaxial layer forms an acute angle θ1 with a plane containing the top surface of the extending portion.

2. The micro semiconductor chip as claimed in claim 1 wherein the refractive index of the side light guide element is greater than 1, and the refractive index of the side light guide element is less than or equal to the refractive index of the epitaxial layer.

3. The micro semiconductor chip as claimed in claim 1, wherein the plane containing the top surface of the epitaxial layer is parallel to a plane containing the bottom surface of the extending portion.

4. The micro semiconductor chip as claimed in claim 1 wherein a plane containing the bottom surface of the extending portion forms an acute angle θ2 with the plane containing the top surface of the extending portion, and the acute angle θ1 is not equal to the acute angle θ2.

5. The micro semiconductor chip as claimed in claim 1 wherein the ratio (L1/L) of the maximum height L1 of the side light guide element in the light extraction direction to the maximum height L of the epitaxial layer in the light extraction direction is between 0.1 and 0.8.

6. The micro semiconductor chip as claimed in claim 1 wherein the ratio (L3/L2) of the maximum height L3 of the connecting portion of the side light guide element in the light extraction direction to the maximum height L2 of the extending portion of the side light guide element in the light extraction direction is between 0.1 and 1.

7. The micro semiconductor chip as claimed in claim 1, further comprising an insulating layer disposed on the side surface of the epitaxial layer, wherein the side light guide element is in contact with the insulating layer disposed on the side surface of the epitaxial layer.

8. The micro semiconductor chip as claimed in claim 7, wherein the connecting portion is in direct contact with the insulating layer, the interface between the connecting portion and the insulating layer has an area S2, and an orthogonal projection of the side light guide element onto the insulating layer has an area S1, and wherein S2/S1 is between 0.1 and 0.8.

9. The micro semiconductor chip as claimed in claim 7, wherein the interface between the connecting portion and the extending portion is perpendicular to the top surface of the epitaxial layer, wherein orthogonal projection of the interface onto the plane containing the top surface of the epitaxial layer is a line segment, and wherein the line segment overlaps a part of the edge of the orthogonal projection of the insulating layer onto the plane containing the top surface of the epitaxial layer.

10. The micro semiconductor chip as claimed in claim 9, wherein a part of the extending portion of the side light guide element is separated from the insulating layer by a space.

11. The micro semiconductor chip as claimed in claim 9, wherein the ratio (W2/W1) of the maximum horizontal width W2 of the connecting portion to the maximum horizontal width W1 of the extending portion is between 0.01 and 0.5.

12. The micro semiconductor chip as claimed in claim 1, wherein the ratio (D1/L) of the minimum distance D1 between the extending portion of the side light guide element and the top surface of the epitaxial layer in the light extraction direction to the maximum height L of the epitaxial layer in the light extraction direction is between 0.01 and 0.5.

13. The micro semiconductor chip as claimed in claim 1, further comprising:
    a top light guide element disposed on the top surface of the epitaxial layer.

14. The micro semiconductor chip as claimed in claim 13, wherein the top light guide element has at least one curved surface.

15. A micro semiconductor structure, comprising:
    a substrate;
    a micro semiconductor chip, disposed on the substrate, wherein the micro semiconductor chip comprises: an epitaxial layer having a top surface, a bottom surface, and a side surface, wherein the top surface is opposite to the bottom surface, and the side surface connects the top surface to the bottom surface; and a side light guide element disposed on the side surface of the epitaxial layer, wherein the side light guide element comprises a connecting portion and an extending portion, wherein the connecting portion is in contact with a part of the extending portion, and the extending portion extends away from the side surface of the epitaxial layer, wherein the extending portion has a top surface and a bottom surface, and wherein a plane containing the top surface of the epitaxial layer forms an acute angle θ1 with a plane containing the top surface of the extending portion; and
    at least one supporting element, wherein one end of the supporting element is disposed on a top surface of the substrate, and another end of the supporting element is connected to the side light guide element of the micro semiconductor chip.

16. A display device, comprising:
    a display substrate; and
    a micro semiconductor chip disposed on the display substrate, wherein the micro semiconductor chip comprises: an epitaxial layer having a top surface, a bottom surface, and a side surface, wherein the top surface is opposite to the bottom surface, and the side surface connects the top surface to the bottom surface; and a side light guide element disposed on the side surface of the epitaxial layer, wherein the side light guide element comprises a connecting portion and an extending portion, wherein the connecting portion is in contact with a part of the extending portion, and the extending portion extends away from the side surface of the epitaxial layer, wherein the extending portion has a top surface and a bottom surface, and wherein a plane containing the top surface of the epitaxial layer forms an acute angle θ1 with a plane containing the top surface of the extending portion.

* * * * *